United States Patent [19]

Kakimi

[11] Patent Number: 4,920,027

[45] Date of Patent: Apr. 24, 1990

[54] LIGHT-SENSITIVE MATERIAL CONTAINING SILVER HALIDE, REDUCING AGENT AND POLYMERIZABLE COMPOUND

[75] Inventor: Fujio Kakimi, Kanagawa, Japan

[73] Assignee: Fuji Photo Film Co., Ltd., Kanagawa, Japan

[21] Appl. No.: 214,961

[22] Filed: Jul. 5, 1988

Related U.S. Application Data

[63] Continuation-in-part of Ser. No. 66,273, Jul. 8, 1987, abandoned, and a continuation-in-part of Ser. No. 101,459, Sep. 28, 1987, abandoned.

[30] Foreign Application Priority Data

Jun. 25, 1986 [JP] Japan ................................ 61-150080
Sep. 26, 1986 [JP] Japan ................................ 61-227767

[51] Int. Cl.$^5$ .......................... G03C 5/54; G03C 1/68; G03C 1/06
[52] U.S. Cl. ..................................... 430/138; 430/203; 430/254; 503/214
[58] Field of Search ..................... 430/138; 503/214; 428/402.2, 321.5

[56] References Cited

U.S. PATENT DOCUMENTS

| | | | |
|---|---|---|---|
| 4,078,423 | 3/1978 | Ogata et al. | 73/141 R |
| 4,098,114 | 7/1978 | Asao et al. | 73/141 R |
| 4,132,112 | 1/1979 | Hosoi et al. | 73/141 R |
| 4,598,035 | 7/1986 | Usami et al. | 430/138 |
| 4,608,330 | 8/1986 | Marabella | 430/138 |
| 4,629,676 | 12/1986 | Hayakawa et al. | 430/138 |
| 4,630,079 | 12/1986 | Kosaka et al. | 346/207 |
| 4,764,451 | 8/1988 | Ishikawa | 430/138 |
| 4,772,531 | 9/1988 | Tsakahara et al. | 430/138 |

FOREIGN PATENT DOCUMENTS 0203613 12/1986 European Pat. Off. ............ 430/203

*Primary Examiner*—Richard L. Schilling
*Attorney, Agent, or Firm*—Sughrue, Mion, Zinn, Macpeak & Seas

[57] ABSTRACT

A light-sensitive material comprises a light-sensitive layer which contains silver halide, a reducing agent and an ethylenic unsaturated polymerizable compound provided on a support (the silver halide and polymerizable compound are contained in microcapsules which are dispersed in the light-sensitive layer), characterized in that the microcapsules have an average particle size (volume average particle diameter) of 8.5 to 20 $\mu$m and the following specific particle size distribution. The amount of the microcapsules having a particle size of not larger than one-sixth part of the average particle size is not more than 1 volume % of the total amount of the microcapsules and the amount of the microcapsules having a particle size of not smaller than twice as large as the average particle size is not more than 1 volume % of the total amount of the microcapsules. The microcapsules preferably have a proportion (a/b) of an average thickness (a) of the shell of the microcapsules to the average particles size (b) in the range of $0.5 \times 10^{-2}$ to $5 \times 10^{-2}$.

12 Claims, No Drawings

LIGHT-SENSITIVE MATERIAL CONTAINING SILVER HALIDE, REDUCING AGENT AND POLYMERIZABLE COMPOUND

CROSS-REFERENCE TO RELATED APPLICATION

This is a continuation-in-part application of U.S. patent application Ser. No. 07/066,273 filed on July 8, 1987 and U.S. patent application Ser. No. 07/101,459 filed on Sept. 28, 1987 both abandoned.

FIELD OF THE INVENTION

This invention relates to a light-sensitive material comprising a light-sensitive layer containing silver halide, a reducing agent and a polymerizable compound provided on a support.

BACKGROUND OF THE INVENTION

A light-sensitive material comprises a light-sensitive layer containing silver halide, a reducing agent and a polymerizable compound provided on a support. The light-sensitive material can be used in an image forming method comprises steps of imagewise exposing the light-sensitive material to form a latent image of the silver halide, and polymerizing the polymerizable compound to form an image corresponding to the latent image.

Japanese Patent Publications No. 45(1970)-11149 (corresponding to U.S. Pat. No. 3,697,275), No. 47(1972)-20741 (corresponding to U.S. Pat. No. 3,687,667) and No. 49(1974)-10697, and Japanese Patent Provisional Publications No. 57(1982)-138632, No. 57(1982)-142638, No. 57(1982)-176033, No. 57(1982)-211146 (corresponding to U.S. Pat. No. 4,557,997), No. 58(1983)-107529 (corresponding to U.S. Pat. No. 4,560,637), No. 58(1983)-121031 (corresponding to U.S. Pat. No. 4,547,450) and No. 58(1983)-169143 describe an image forming method comprises steps of developing the exposed silver halide by a developing solution, and polymerizing the polymerizable compound in the presence of a reducing agent (which is oxidized) to form a polymer image. Thus, the method needs a wet development process employing the developing solution. Therefore, the process takes a relatively long time for the operation.

Japanese Patent Provisional Publications No. 61(1986)-69062 and No. 61(1986)-73145 (the contents of both publications are described in U.S. Pat. No. 4,629,676 and European Patent Provisional Publication No. 0174634A2) describe an improved image forming method employing a dry process. The image forming method comprises steps of imagewise exposing a recording material (i.e., light-sensitive material) comprising a light-sensitive layer containing a light-sensitive silver salt (i.e., silver halide), a reducing agent, a polymerizable compound having at least one carbon-carbon unsaturated bond and a binder provided on a support to form a latent image, and heating the recording material to polymerize the polymerizable compound within the area where the latent image of the silver halide has been formed. The method employing the dry process is also described in Japanese Patent Provisional Publications No. 61(1986)-183640, No. 61(1986)-188535 and No. 61(1986)-228441.

The above-mentioned image forming methods are based on the principle in which the polymerizable compound is polymerized within the area where a latent image of the silver halide has been formed.

Further, Japanese Patent Provisional Publications No. 61(1986)-243449 and No. 61(1986)-260241 describes another image-forming method in which the polymerizable compound within the area where a latent image of the silver halide has not been formed is polymerized. In this method, the reducing agent functions as a polymerization inhibitor within the area where a latent image of the silver halide has been formed. Accordingly, the polymerizable compound within the other area is polymerized when the light-sensitive material is heated.

Japanese Patent Provisional Publication No. 61(1986)-73145 (corresponding to U.S. Pat. No. 4,629,676 and European Patent Provisional Publication No. 0174634A2) describes an embodiment of the light-sensitive material, which employs microcapsules containing components of the light-sensitive layer, such as polymerizable compound.

In the image-forming method of the light-sensitive material employing the microcapsules, the microcapsules containing the unpolymerized polymerizable compound are ruptured by pressing to form an image after the development process. It is stated that the microcapsules generally have a size of not more than 80 μm and further in order to ensure ease of handling during storage, the microcapsules having a particle size not larger than 20 μm are preferred. It is further stated that from the viewpoint of easy rupture under application of pressure, the microcapsules having a particle size not smaller than 0.1 μm are preferred. Thus, the light-sensitive material containing microcapsules having a diameter of 0.1 to 20 μm is advantageously easy to handle during the storage and under application of pressure. However, according to the study of the present inventor, it was observed that the image obtained by the use of a light-sensitive material using microcapsules of such particle size sometimes partially suffered stains and the image formation was partially defective.

SUMMARY OF THE INVENTION

The present inventor has discovered that the above-mentioned stains are brought about by a portion of microcapsules having a relatively large particle size compared to the average particle size (not smaller than twice as large as the average particle size), and that the defective image formation is caused by a portion of microcapsules having a relatively small particle size compared to the average particle size (not larger than one sixth part, i.e., 1/6, of the average particle size).

Therefore, an object of the present invention is to provide a light-sensitive material which gives an improved clear image.

There is provided by the present invention a light-sensitive material comprising a light-sensitive layer which contains silver halide, a reducing agent and a polymerizable compound provided on a support, said silver halide and polymerizable compound being contained in microcapsules which are dispersed in the light-sensitive layer, characterized in that the microcapsules have an average particle size (volume average particle diameter) of 8.5 to 20 μm and the following specific particle size distribution. The amount of the microcapsules having a particle size of not larger than one sixth part (1/6) of the average particle size is not more than 1 volume % of the total amount of the microcapsules and the amount of the microcapsules having a particle size of not smaller than twice as large as the average particle size is not more than 1 volume % of the total amount of the microcapsules.

It is preferred that the microcapsules have a proportion (a/b) of an average thickness (a) of the shell of the microcapsules to the average particle size (b) in the range of $0.5 \times 10^{-2}$ to $5 \times 10^{-2}$.

The present inventor has found that where the relative particle size of the microcapsule is larger than twice as large as the average particle size (in the range of 8.5 to 20 μm), the physical stability of the microcapsule in the course of the preparation, the storage and the image forming procedure of the light-sensitive material extremely decreases, even if the absolute particle size of the individual microcapsule is not larger than 20 μm. Further, where the relative particle size of the microcapsule is smaller than one sixth of the average particle size, it is difficult to rupture the microcapsule containing the unpolymerized polymerizable compound by application of pressure, even if the absolute particle size of the individual microcapsule is not smaller than 0.1 μm.

The light-sensitive material of the present invention contains almost no microcapsules (such as not more than 1 volume %) having a particle size of not smaller than twice the average particle size which cause stains in the formation of an image, and also contains almost no microcapsules (such as not more than 1 volume %) having a particle size of not larger than one sixth part of the average particle size which cause production of missing area in the formation of the image. Therefore, the light-sensitive material of the invention gives a very clear image which is reduced in occurence of the stains and has a high image density throughout.

Further, according to the study of the present inventor, it was observed that the image sometimes partially suffered stains other than those caused by the above-mentioned large microcapsules. The present inventor has discovered that the former (newly observed) stains are brought about by physically broken microcapsules and that the microcapsules are broken by pressing or scratching the light-sensitive layer in the course of handling the light-sensitive material such as the preparation, storage, conveyance and image forming procedure of the material.

Various methods for increasing physical stability of microcapsules can be employed only to protect the microcapsules from being broken. However, it should be considered that the image formation is performed by rupture of the microcapsules in which the polymerizable compound has not been polymerized after a development process. Therefore, in order to form a clear image, it is necessary that almost all of the microcapsules containing the unpolymerized polymerizable compound are easily and completely ruptured under pressure, while the physical stability of the microcapsules is kept at a high level.

The present inventor has found that where the proportion (a/b) of the average thickness (a) of the shell to the average particle size (b) is not less than $0.5 \times 10^{-2}$, the physical stability of the microcapsules in the course of handling the light-sensitive material prominently increases. Further, where the proportion (a/b) is not larger than $5 \times 10^{-2}$, the microcapsule containing the unpolymerized polymerizable compound is easily and completely ruptured under pressure. In other words, where the proportion (a/b) ranges from $0.5 \times 10^{-2}$ to $5 \times 10^{-2}$, the physical stability of the microcapsule in the course of handling the light-sensitive material can be consistent with the complete rupture of the microcapsules in the course of the image formation. Therefore, the light-sensitive material of the invention gives a more improved clear image, when the microcapsules have the above-mentioned proportion (a/b) in the range of $0.5 \times 10^{-2}$ to $5 \times 10^{-2}$.

DETAILED DESCRIPTION OF THE INVENTION

The microcapsules used in the light-sensitive material of the present invention have an average particle size of 8.5 to 20 μm. The term "particle size" of the microcapsule in the present specification means a volume-average particle diameter measured by using a coltar counter. The average particle size of the microcapsules is preferably in the range of 9 to 17 μm, and more preferably in the range of 9.5 to 15 μm.

Further, the microcapsules used in the light-sensitive material of the present invention have such a particle size distribution that the amount of the microcapsules having a particle size of not larger than one sixth of the average particle size is not more than 1 volume % of the total amount of the microcapsules. More preferably, the amount of the microcapsules having a particle size of not larger than half of the average particle diameter is not more than 20 volume % of the total amount of the microcapsules.

Furthermore, the microcapsules used in the light-sensitive material of the invention have such a particle size distribution that the amount of the microcapsules having a particle size of not smaller than twice as large as the average particle size is not more than 1 volume % of the total amount of the microcapsules. More preferably, the amount of the microcapsules having a particle size of not smaller than 1.5 times the average particle size is not more than 20 volume % of the total amount of the microcapsules.

The microcapsules having the above-mentioned particle size distribution can be obtained by controlling (1) emulsifying conditions (e.g., emulsifying time, stirring rate, the concentration of emulsifying agent, the type of emulsifier, etc.) or (2) polymerizing conditions (e.g., the nature of polymerization reagent, polymerizing temperature, etc.) in the course of the preparation of the microcapsules. The process for obtaining the narrow particle size distribution of the microcapsules is described below.

(1) Prior to encapsulation of a liquid, the liquid is emulsified in another liquid (medium) which is not miscible with the former liquid. Accordingly, the particle size distribution of microcapsules often reflects the droplet size distribution of the emulsion. Therefore, the particle size of the microcapsules largely depends on the concentration of emulsifying agent or the stirring rate. For example, the particle size distribution of microcapsules is narrowed and the peak of the distribution curve is sharpened with increasing the stirring rate. The effect of the stirring rate on microcapsules is the same as that on emulsion. Further, it is well known that the droplet size distribution of emulsion is narrowed and the droplet size is decreased with increasing the concentration of emulsifying agent. Similarly, the particle size distribution of the microcapsules can be narrowed.

(2) In the case that microcapsules are prepared by interfacial polymerization, the polymerization process is performed after the above-mentioned emulsifying process. Therefore, polymerizing conditions may have effects on the the particle size distribution of the microcapsules. It is observed that the particle size distribution is narrowed, the peak of the distribution curve is sharpened and the particle size is decreased with increasing the reaction rate of the polymerization. The reaction rate of the polymerization depends on the nature and the concentration of polymerization reagent and the temperature of the reaction. For example, the microcapsules which are prepared at high temperatures have a narrow particle size distribution, a sharp peak of the distribution curve and a small average particle size. Further, it should be noted that where microcapsules are prepared at a rapid reaction rate of the polymerization, the particle size distribution of the microcapsules well reflects the droplet size distribution of the emulsion. On the other hand, the particle size distribution differs from the droplet size distribution at a slow reaction rate of the polymerization.

It is preferred that the microcapsules used in the light-sensitive material of the present invention have a proportion (a/b) of an average thickness (b) of the shell to the average particle size (b) ranges from $0.5 \times 10^{-2}$ to $5 \times 10^{-2}$. The average particle size more preferably ranges from 3 to 10 μm. The thickness of the shell of microcapsule in the present specification is a value obtained from an observation of a fragment of the microcapsule using an electron microscope or an optical microscope.

The microcapsules having the above-mentioned proportion can be obtained by controlling (1) the amount of the core, material, (2) the particle size of the core material or (3) the chemical structure of the shell material in the course of the preparation of the microcapsules. The process for preparation of the microcapsules having the above-mentioned proportion is described below.

(1) In the case that microcapsules are prepared by coacervation, the thickness of the shell is decreased with increasing the amount of the core material. Thus, there is a correlation between the thickness of the shell and the amount of the core material. Accordingly, the thickness of the shell can be adjusted according to the correlation which has been obtained by preliminary experiments.

(2) When the amount of the core material is held constant, the surface area of the core material is decreased with increasing the particle size of the core material. The thickness of the shell depends on the amount of the shell material per the surface area of the core material. Accordingly, the thickness of the shell may be increased with increasing the particle size of the core material.

(3) In the case that microcapsules are prepared by interfacial polymerization, the thickness of the shell varies on the chemical structure of the shell material. For example, the shell is relatively thin when the shell material is a polymer having many cyclic moieties in its chemical structure. On the other hand, the shell is relatively thick when the shell material is a polymer having many straight chains.

U.S. Pat. No. 4,598,035 describes a heat-sensitive recording material comprising a support having thereon a layer containing microcapsules containing at least a first component capable of causing a coloring reaction as a core material, and at least a second component causing said coloring reaction with said first component in the microcapsules, wherein the microcapsules contain an organic solvent in the cores thereof, the average particle size of the microcapsules is 0.1 to 8 microns, and the value of (number average wall thickness/-volume average particle size) of the microcapsules is $1 \times 10^{-2}$ to $5 \times 10^{-1}$.

The silver halide, the reducing agent, the polymerizable compound, the support and the microcapsules containing the silver halide and the polymerizable compound which constitute the light-sensitive material of the invention are described below. Thus composed material is referred hereinafter to as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m² to 10 g/m². The silver content of the silver halide in the light-sensitive layer preferably is not more than 0.1 g/m², more preferably in the range of from 1 mg to 90 mg/m².

There is no specific limitation with respect to the polymerizable compound, except that the polymerizable compound has an ethylenic unsaturated group. Any known ethylenic unsaturated polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate or polyoxyalkylenated bisphenol A.

The polymerizable compounds can be used singly or in combination of two or more compounds. For example, a mixture of two or more polymerizable componds can be employed. Further, compounds formed by bonding a polymerizable group such a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The silver halide and polymerizable compound are contained in the microcapsules which are dispersed in the light-sensitive layer. There is no specific limitation on the microcapsules, and various known manners can be employed. The reducing agent and the other optional component can be contained in the microcapsules or arranged outside of the microcapsules in the light-sensitive layer. Generally, the reducing agent is preferably contained in the microcapsule, because the reaction can progress smoothly in such case. The reducing agent is more preferably dispersed or dissolved in the core material of the microcapsules. In the case that the heat development is utilized in the use of the light-sensitive material, there is no problem in arranging the reducing agent outside of the microcapsule, because the reducing agent can permeate the microcapsule to reach the core material.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm. In the light-sensitive material of the invention, the mean grain size of the silver halide grains preferably is not more than the 5th part of the mean size of the microcapsules, more preferably is not more than the 10th part. It is observed that when the mean size of the microcapsules is not less than 5 times as much as the mean grain size of silver halide grains, even and uniform image can be obtained. It is preferred that at least 70 weight % (more preferably 90 weight %) of the silver halide is embedded in the shell material of the microcapsules.

Further, two or more kinds of the microcapsules differing from each other with respect to at least one of the silver halide and the polymerizable compound can be employed. Furthermore, three or more kinds of the microcapsules differing from each other with respect to the color image formation substance is preferably employed to form a full color image.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed in polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291–334 (1977), Research Disclosure No. 17029, pp. 9–15 (June 1978), and Research Disclosure No. 17643, pp. 22–31 (December 1978). The reducing agents described in these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-penytlphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent is in the light-sensitive layer preferably ranges from 0.1 to 1,500 mole % based on the amount of silver (contained in the above-mentioned silver halide and an organic silver salt).

The light-sensitive material can be prepared by arranging a light-sensitive layer containing the above-mentioned components on a support. There is no limitation with respect to the support. In the case that heat development is utilized in the use of the light-sensitive material, material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610.

Various embodiments of the light-sensitive materials, optional components which may be contained in the light-sensitive layer, and auxiliary layers which may be optionally arranged on the light-sensitive materials are described below.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiators and solvents of the polymerizable compound.

The light-sensitive material can obtained a polymer image, and the further obtained a color image containing the color image forming substance as optional components.

There in no specific limitation with respect to other color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substance) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29-58 (pressure-sensitive copying paper), pp. 87-95 (azo-graphy), pp. 118-120 (heat-sensitive color formation by a chemical change) or in MSS. of the seminar promoted by the Society of Kinki Chemical Industry, "The Newest Chemistry of Coloring Matter—Attractive Application and New Development as a Functional Coloring Matter", pp. 26-32 (June, 19, 1980). Examples of the color formation system specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diasosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

In the case that the color image forming substance comprising two components (e.g., color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 20 parts by weight, and more preferably from 2 to 7 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an $\alpha$-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an anti-fogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckman rearrangement, and the like; and those capable of releasing bases by electrolysis. Preferred examples of the base precursors include guanidine tricloroacetate, piperdine trichloroacetate, morpholine trichloroacetate, p-toluidine tricloroacetate, 2-picoline trichloroacetate, guanidine phenylsulfonylacetate, guanidine 4-chlorophenylsulfonylacetate, guanidine 4-methyl-sulfonylphenylfulfonylacetate, and 4-acetylaminomethyl propionate.

The bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, the reducing agent and the polymerizable compound are preferably contained in a microcapsule and the base or base precursor is prefarably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in a aqueous solution of a water retention agent, orr under condition that the base or base precursor is absorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl substrate described in Research Disclosure pp. 26-28 (December 1976).

The thermal polymerization initiators employable in the light-sensitive material preferably are compounds that are decomposed under heating to generate a polymerization initiating species, particularly a radical, and those commonly employed as initiators or radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. NO. 3,625,736; microcapsules particles containing no color former described in U.K. Pat. No. 1,235,991; and cellulose particles, and inorganic particles, such as particles of talc, kaolin, bentonite, agalmatolite, zinc oxide, titanium or aluminum oxide described in U.S. Pat. No. 2,711,375. Such particles preferably have a mean size of 3 to 50 $\mu$m, more preferably 5 to 40 $\mu$m. The size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be obtained in the light-sensitive layer are also described in the above-mentioned publications and applications concerning the light-sensitive material, and in Research Disclosure Vol. 170, No. 17029, pp. 9–15 (June 1978).

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When sensitizing dyes are added to the silver halide emulsion, the sensitizing dye is preferably added during the preparation of the emulsion. When the organic silver salts are introduced into the light-sensitive microcapsule, the emulsion of the organic silver salts can be prepared in the same manner as in the preparation of the silver halide emulsion.

In the preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is polymerizable compound containing the silver halide can be prepared using the silver halide emulsion. The light-sensitive composition can be also prepared using the silver halide powders which can be prepared by lyopilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Further, optional components, such as the reducing agents, the color image forming substances may dissolved, emulsified or dispersed in the light-sensitive composition. Furthermore, the necessary components for preparation of the microcapsules, such as shell wall-forming materials can be incorporated into in the light-sensitive composition.

The light-sensitive composition are preferably emulsified in an aqueous medium to prepare the microcapsule in the invention. The necessary components for preparation of the microcapsule, such as shell materials can be incorporated into the emulsion. Further, other components such as the reducing agent can be added to the emulsion.

The emulsion of the light-sensitive composition is then processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

In the above-mentioned process, an aqueous dispersion of the microcapsules can be obtained. The light-sensitive material of the invention can be prepared by coating and drying the dispersion of the microcapsules on a support in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity or silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedure and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized in the same manner as the light-sensitive material described in Japanese Patent Provisional Publication No. 61(1986)-260241.

A color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the light-sensitive material. In the case that a porous material, such as paper is employed as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$.cm/cm$^2$.sec.cmHg can be used as the binder to protect the color of the image formed on the image-receiving material.

The image-receiving layer can contain a granulated thermoplastic compound to obtain a glossy image. Further, the image-receiving layer can contain a white pigment such as titanium dioxide to function as a white reflection layer. Furthermore, a photo polymerization initiators or a thermal polymerization initiators can be contained in the image-receiving layer to polymerize the unpolymerizable polymerizable compound.

The thickness of the image-receiving layer preferably ranges from 1 to 100 μm.

A protective layer can be provided on the surface of the image-receiving layer.

After the development process of pressing of light-sensitive material in contact with the image-receiving material to transfer the polymerizable compounds which is still polymerizable to the image-receiving material, a polymer image can be obtained in the image-receiving material. The process for pressing can be carried out by various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance to unfixed portion, a color image can be produced on the image-receiving material.

After the image was obtained, the image-receiving material can be heated. In the above-mentioned method, an improved image can be obtained by polymerizing the unpolymerizable polymerized compound which has been transferred on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of Silver Halide Emulsion

In 3,000 ml of water were dissolved 40 g of gelatin and 23.8 g of pottasium bromide, and the resulting gelatin solution was kept at 50° C. To the gelatine solution, 200 ml of an aqueous solution containing 34 g of silver nitrate was added over a period of 10 minutes while stirring. To the solution, 100 ml of an aqueous solution containing 3.3 g of potassium iodide was added over a period of 2 minutes to obtain a silver bromoiodide emulsion. After the emulsion was adjusted to a pH for sedimentation, excess salts were removed, and the emulsion was adjusted to a pH of 6.0. The yield of the emulsion was 400 g.

Preparation of Silver Benzotriazole Emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of Light-Sensitive Composition

In 100 g of trimethylolpropane triacrylate were dissolved 0.40 g of the following copolymer and 6.00 g of Pargascript Red I-6-B (tradename of Ciba Geigy).

(Copolymer)

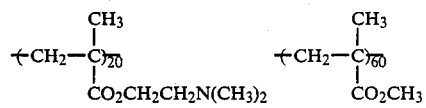

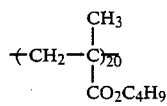

To 18.00 g of the resulting solution were added a solution in which 0.61 g of the following reducing agent (I) and 1.22 g of the following reducing agent (II) are dissolved in 1.80 g of methylene chloride.

(Reducing agent (I))

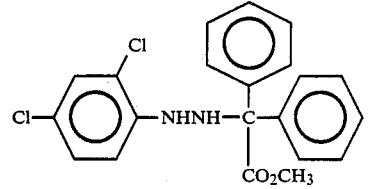

(Reducing agent (II))

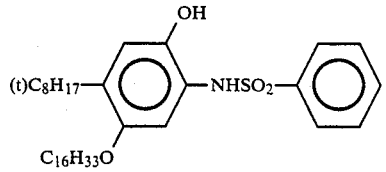

To the mixture were further added 4.06 g of the silver halide emulsion and 3.35 g of the silver benzotriazole emulsion, and the mixture was stirred at 15,000 r.p.m. for 5 minutes to obtain a light-sensitive composition (emulsified average particle size: approx. 1 μm).

Preparation of Light-Sensitive Microcapsule

To 10.51 g of 18.6% aqueous solution of isobutylene/maleic anhydride copolymer (Isobam, produced by Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 min. to emulsify the light-sensitive composition in the aqueous medium (emulsified average particle size: 8 μm).

To 72.5 g of the aqueous emulsion were added to 8.32 g of 40% aqueous solution of urea, 2.82 g of 11.3% aqueous solution of resorcinol, 8.56 g of 37% aqueous solution of formaldehyde, and 2.74 g of 8.76% aqueous solution of ammonium sulfate in this order, and the mixture was heated at 60° C. for 2 hour while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion of light-sensitive microcapsules having the amino formaldehyde resin shell.

Measuring the particle size of the microcapsules by colter counter, the average particle size was 9.5 μm. The microcapsules having a particle size of not larger then 1.58 μm (the 6th part of the average particle size) and those having a particle size of not smaller than 19 μm (twice the average particle size) were not observed. The amount of the microcapsules having a particle size of not larger than 4.75 μm (a half of the average particle diamter) was 13 volume % of the total amount of the microcapsules, and the amount of those having a particle size of not smaller than 14.25 μm (1.5 times of the average particle diameter) was 11 volume %.

Preparation of Light-Sensitive Material

To 10.0 g of the light-sensitive microcapsule dispersion was added 3.6 g of 5% solution (solvent: water/ethanol=50/50 as volume ratio) of guanidine trichroloacetate to prepare a coating solution. The coating solution was coated on the polyethyleneterephthalate film (thickness: 100 μm) using a coating rod of #40 to give a layer having a thickness of 80 μm and dried at about 40° C. to obtain a light-sensitive material (A).

EXAMPLE 2 and COMPARISON EXAMPLE 1

Each of the light-sensitive microcapsules set forth in Table 1 was prepared in the same manner as in Example 1 except that the emulsifying time was adjusted.

Each of the light-sensitive materials, (B), (X), (Y) and (Z) was respectively prepared in the same manner as in Example 1 except that these light-sensitive microcapsules were used.

Each of the emulsifying times of the light-sensitive materials was 1 min. and 40 sec. (B), 1 min. and 30 sec. (X), 1 min. (Y) and 5 min. (Z), respectively, while the emulsifying time of the light-sensitive material was 2 min. at 7,000 r.p.m.

In Table 1, "$\geq 2\bar{r}$" means the volume ratio (%) of the microcapsules having a particle size of not smaller than twice the average particle size; "$\geq 1.5\bar{r}$" means the ratio of those having a size of not smaller than 1.5 times of the average; "$\leq \bar{r}/2$" means the ratio of those having a size of not larger than half of the average; and "$\leq \bar{r}/6$" means the ratio of those having a size of not larger than one sixth part of the average. The unit of the particle size in Table 1 is "μm".

TABLE 1

| Light-Sensitive Material | Average Particle Size (r) | ≥2 r | ≥1.5 r | ≤r/2 (particle size) | ≤r/6 |
|---|---|---|---|---|---|
| (A) | 9.5 | 0% (≥19) | 11% (≥14.25) (≤4.25) | 13% (≤1.58) | 0% |
| (B) | 15.0 | 0.5% (≤30) | 14% (≥22.5) | 15% (≤7.5) | 0% (≤2.5) |
| (X) | 19.0 | 1.5% (≥38) | 23% (≥28.5) | 25% (≤9.5) | 0% (≤3.16) |
| (Y) | 25.0 | 2.0% (≥50) | 25% (≥37.5) | 28% (≤12.5) | 0% (≤4.16) |
| (Z) | 2.1 | 0% (≥4.2) | 12% (≥3.15) | 21% (≤1.05) | 1.5% (≤0.35) |

Preparation of Image-Receiving Material

To 150 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer.

The coarse dispersion was then finely dispersed in Dynomill dispersing device. To 200 g of the resulting dispersion were added 6 g of 50% latex of SBR (styrenebutadiene rubber) and 55 g of 8% aqueous solution of polyvinyl alcohol, and the resulting mixture was made uniform. The mixture was then uniformly coated on an art paper having a basis weight of 43 g/m² to give a layer having a wet thickness of 30 μm and dried to obtain an image-receiving material.

Evaluation of Light-Sensitive Materials

Each of the light-sensitive materials (A) to (Z) prepared in Examples 1 & 2 and Comparison Example 1 was imagewise exposed to light using a tungsten lamp at 2,000 lux for 1 second and then heated on a hot plate at 125° C. for 40 seconds. Each of the exposed and heated light-sensitive materials was then combined with the image-receiving material and passed through press rolls under pressure of 350 kg/cm².

As a result, the light-sensitive materials (A) and (B) gave a clear positive image having a reflection density of about 1.0. Further, the density on the image-receiving material corresponding to the exposed area was not higher than 0.1.

The light-sensitive materials (X) and (Y) also gave a positive image having a reflection density of about 1.0. However, the dotted stains were remarkably observed.

The light-sensitive material (Z) gave a positive image having a low reflection density of about 0.7. Further, the insufficiently transferred area was observed in the image.

EXAMPLE 3

Preparation of Light-Sensitive Microcapsule

To 10.51 g of 18.6% aqueous solution of isobutylene/maleic anhydride copolymer (Isobam, produced by Kuraray Co., Ltd.) was added 48.56 g of 2.89% aqueous solution of pectin. After the solution was adjusted to a pH of 4.0 using 10% sulfuric acid, the light-sensitive composition prepared in Example 1 was added to the resulting solution, and the mixture was stirred at 7,000 r.p.m. for 2 min. to emulsify the light-sensitive composition in the aqueous medium (emulsified average particle size: 8 μm).

To 60 g of the aqueous emulsion were added 8.32 g of 40% aqueous solution of urea, 2.82 g of 11.3% aqueous solution of resorcinol, 8.56 g of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 2 g of 30.9% aqueous solution of sodium hydrogen sulfite was added to the mixture to obtain a dispersion of light-sensitive microcapsules having a shell material made of amino formaldehyde resin.

Measurement of Particle Size and Thickness of Shell

Measuring the particle size of the microcapsules by colter counter (TA-II, produced by Colter Electronics), the average particle size was 9.5 μm. The particle size distribution of the microcapsules will be set forth in Table 2.

On a polyethylene terephthalate film base which had been treated with a surface treatment, the dispersion of light-sensitive microcapsules was coated. The microcapsules were embedded in an epoxy resin, and then left at 60° C. over a day to fix them on the film base. The microcapsule was sliced by an ultramicrotome (MT-I, produced by Du Pont (E.I.) de Nemours & Co.) to obtain an ultrathin section on which the center of the microcapsule was located. A photograph of the ultriathin section was taken on a film (Fuji FG Film for Electron Microscope, produced by Fuji Photo Film Co., Ltd.) using a transmission electron microscope (HU-12A, produced by Hitachi, Ltd.) under a magnification of 10,000 to 15,000 times at a pressure voltage of 100 KV. Measuring the thickness of the shell from the obtained photograph, the average thickness was 0.8 μm.

Preparation of Light-Sensitive Material

To 10.0 g of the light-sensitive microcapsule dispersion was added 3.6 g of 5% solution (solvent: water/ethanol=50/50 as volume ratio) of guanidine trichroloacetate to prepare a coating solution. The coating solution was coated on the polyethylene terephthalate film (thickness: 100 μm) using a coating rod of #40 to give a layer having a thickness of 80 μm and dried at about 40° C. to obtain a light-sensitive material (G).

COMPARISON EXAMPLE 2

Preparation of Light-Sensitive Microcapsule

A light-sensitive microcapsule dispersion was prepared in the same manner as in Example 3, except that the emulsified average particle size of the light-sensitive composition was changed to 25 μm from 8 μm. The particle size distribution of the microcapsules will be set forth in Table 2.

Measuring the microcapsules in the same manner as in Example 3, the volume average particle size was 25 μm, and the average thickness of the shell was 0.1 μm.

Preparation of Light-Sensitive Material

A light-sensitive material (H) was prepared in the same manner as in Example 3, except that the above obtained light-sensitive microcapsule was used.

COMPARISON EXAMPLE 3

Preparation of Light-Sensitive Microcapsule

A light-sensitive microcapsule dispersion was prepared in the same manner as in Example 3, except that the emulsified average particle size was changed to 2 μm from 8 μm. The particle size distribution of the microcapsules will be set forth in Table 2.

Measuring the microcapsule in the same manner as in Example 3, the volume average particle size was 2 μm, and the average thickness of the shell was 0.07 μm.

Preparation of Light-Sensitive Material

A light-sensitive material (I) was prepared in the same manner as in Example 3, except that the above obtained light-sensitive microcapsule was used.

EXAMPLE 4

Preparation of Light-Sensitive Microcapsule

To the light-sensitive composition prepared in Example 1 was dissolved 10 g of an adduct of xylylene diisocyanate and trimethylol-propane (Takenate D11ON, produced by Takeda Chemical Industries, Ltd.). The resulting solution was added to 50 g of 4% aqueous solution of methyl cellulose (Metholose, produced by Shinetsu Chemical Industry Co., Ltd.), and mixture was stirred by homozinizer at 5,000 r.p.m. for 1 minute to obtain an emulsion. The emulsion was reacted for 2 hours at 60° C. while stirring at 1,000 r.p.m. to obtain a dispersion of light-sensitive microcapsules having a shell material made of polyurea resin.

Measuring the light-Sensitive microcapsule in the same manner as in Example 3, the volume average particle size was 10 μm, and the average thickness of the shell was 0.1 μm. The particle size distribution of the microcapsules will be set forth in Table 2.

Preparation of Light-Sensitizing Material

A light-sensitive material (J) was prepared in the same manner as in Example 3, except that the above obtained light-sensitive microcapsule was used.

COMPARISON EXAMPLE 4

Preparation of Light-Sensitive Microcapsule

A light-sensitive microcapsules dispersion was prepared in the same manner as in Example 4, except that the amount of the adduct of xylylene diisocyanate and trimethylol-propane was changed to 2 g from 10 g.

Measuring the microcapsule in the same manner as in Example 3, the volume average particle size was 10 μm, and the average thickness of the shell was 0.02 μm. The particle size distribution of the microcapsules will be set forth in Table 2.

Preparation of the Light-Sensitive Material

A light-sensitive material (K) was prepared in the same manner as in Example 3, except that the above obtained light-sensitive microcapsule was used.

COMPARISON EXAMPLE 5

Preparation of Light-Sensitive Microcapsule

A light-sensitive microcapsules dispersion was prepared in the same manner as in Example 4, except that the amount of the adduct of xylylene diisocianate and trimethylol-propane was changed to 20 g from 10 g.

Measuring the microcapsule in the same manner as in Example 3, the volume average particle size was 30 μm, and the average thickness of the shell was 1.8 μm. The particle size distribution of the microcapsules will be set forth in Table 2.

Preparation of the Light-Sensitive Material

A light-sensitive material (L) was prepared in the same manner as in Example 3, except that the above obtained light-sensitive microcapsules was used.

The particle size distribution of the microcapsules contained in each of the light-sensitive materials (G), (H), (I), (J), (K) and (L) are summarized in Table 2.

In Table 2, "$\geq 2\bar{r}$" means the volume ratio (%) of the microcapsules having a particle size of not smaller than twice the average particle size; "$\geq 1.5\bar{r}$" means the ratio of those having a size of not smaller than 1.5 times of the average; "$\leq \bar{r}/2$" means the ratio of those having a size of not larger than half of the average; and "$\leq \bar{r}/6$" means the ratio of those having a size of not larger than one sixth part of the average. The unit of the particle size in Table 2 is "$\mu m$".

TABLE 2

| Light-Sensitive Material | Average Particle Size (r) | Volume Ratio of | | | |
|---|---|---|---|---|---|
| | | $\geq 2r$ | $\geq 1.5r$ | $\leq r/2$ | $\leq r/6$ |
| | | (particle size) | | | |
| (G) | 9.5 | 0% ($\geq 19$) | 11% ($\geq 14.25$) | 13% ($\leq 4.25$) | 0% ($\leq 1.58$) |
| (H) | 25.0 | 2.0% ($\geq 50$) | 25% ($\geq 37.5$) | 28% ($\leq 12.5$) | 0% ($\leq 4.16$) |
| (I) | 2.0 | 2.5% ($\geq 4$) | 20% ($\geq 3$) | 25% ($\leq 1$) | 6% ($\leq 0.33$) |
| (J) | 10.0 | 0.7% ($\geq 20$) | 13% ($\geq 15$) | 11% ($\leq 5$) | 0% ($\leq 1.66$) |
| (K) | 10.0 | 4.6% ($\geq 20$) | 12% ($\geq 15$) | 12% ($\leq 5$) | 0% ($\leq 1.66$) |
| (L) | 30.0 | 13% ($\geq 60$) | 24% ($\geq 45$) | 15% ($\leq 15$) | 0% ($\leq 5$) |

Further, the volume average particle size and the average thickness of the shell of the microcapsules contained in each of the light-sensitive materials are summarized in Table 3.

In Table 3, the shell material (I) is an amino formaldehyde resin, and the shell material (II) is a polyurea resin. Further, "(a)" means the the average thickness of the shell and "(b)" means the average particle size.

TABLE 3

| Light-sensitive Material | Shell Material | Average Particle Size ($\mu m$) | Average Thickness ($\mu m$) | Proportion of (a) to (b) (a/b) |
|---|---|---|---|---|
| (G) | (I) | 9.5 | 0.08 | $0.84 \times 10^{-2}$ |
| (H) | (I) | 25.0 | 0.10 | $0.4 \times 10^{-2}$ |
| (I) | (I) | 2.0 | 0.07 | $3.5 \times 10^{-2}$ |
| (J) | (II) | 10.0 | 0.1 | $1.0 \times 10^{-2}$ |
| (K) | (II) | 10.0 | 0.02 | $0.2 \times 10^{-2}$ |
| (L) | (II) | 30.0 | 1.8 | $6.0 \times 10^{-2}$ |

Evaluation of Light-Sensitive Material

Each of the light-sensitive materials (G) to (L) prepared in Examples 3 & 4 and Comparison Examples 2 to 5 was imagewise exposed to light using a tungsten lamp at 2,000 lux for 1 second and then heated on a hot plate at 125° C. for 40 seconds. Each of the exposed and heated light-sensitive materials was then combined with the image-receiving material and passed through press rolls under pressure of 350 kg/cm².

As a result, the light-sensitive materials (G) and (J) gave a clear positive image having a reflection density of about 1.0. Further, the density on the image-receiving material corresponding to the exposed area was not higher than 0.1.

The light-sensitive materials (H) and (K) also gave a positive image having a reflection density of about 1.0. However, the scratched stains were remarkably observed.

The light-sensitive materials (I) and (L) gave a positive image having a low reflection density of about 0.7. Further, the insufficiently transferred area was observed in the image.

I claim:

1. A light-sensitive material comprising a light-sensitive layer containing silver halide grains, a reducing agent and a polymerizable compound provided on a support, said silver halide grains and polymerizable compound being contained in microcapsules which are dispersed in the light-sensitive layer, wherein the microcapsules have an average particle size of 8.5 to 20 $\mu m$ in terms of volume-average particle diameter and such a particle size distribution that the amount of the microcapsules having a particle size of not larger than one sixth part of the average particle size is not more than 1 volume % of the total amount of the microcapsules and the amount of the microcapsules having a particle size of not smaller than twice as large as the average particle size is not more than 1 volume % of the total amount of the microcapsules.

2. The light-sensitive material as claimed in claim 1, wherein the microcapsules have an average particle size of 9 to 17 $\mu m$.

3. The light-sensitive material as claimed in claim 1, wherein the microcapsules have an average particle size of 9.5 to 15 $\mu m$.

4. The light-sensitive material as claimed in claim 1, wherein the microcapsules have such a particle size distribution that the amount of the microcapsules having a particle size of not larger than half of the average particle size is not more than 20 volume % of the total amount of the microcapsules and the amount of the microcapsules having a particle size of not smaller than 1.5 times as large as the average particle size is not more than 20 volume % of the total amount of the microcapsules.

5. The light-sensitive material as claimed in claim 1, wherein the microcapsules have a proportion of an average thickness of the shell of the microcapsules to the average particle size ranges from $0.5 \times 10^{-2}$ to $5 \times 10^{-2}$.

6. The light-sensitive material as claimed in claim 1, wherein the microcapsules having a shell material made of an amino aldehyde resin.

7. The light-sensitive material as claimed in claim 1, wherein the microcapsules having a shell material made of a polyurea resin, a polyurethan resin or a combination of a polyurea resin and a polyurethan resin.

8. The light-sensitive material as claimed in claim 1, wherein at least 70 weight % of the silver halide grains are embedded in the shell material of the microcapsules.

9. The light-sensitive material as claimed in claim 1, wherein at least 90 weight % of the silver halide grains are embedded in the shell material of the microcapsules.

10. The light-sensitive material as claimed in claim 1, wherein the reducing agent is contained in the microcapsules.

11. The light-sensitive material as claimed in claim 1, wherein the microcapsules further contain a color image forming substance.

12. The light-sensitive material claimed in claim 1, wherein the silver halide grains have a mean grain size in the range of 0.001 to 5 $\mu m$.

* * * * *